(12) United States Patent
Qian et al.

(10) Patent No.: US 12,174,261 B2
(45) Date of Patent: Dec. 24, 2024

(54) BATTERY PROTECTION CHIP, POLLING DETECTION CIRCUIT AND METHOD BASED ON BATTERY PROTECTION CHIP

(71) Applicant: SG MICRO CORP, Beijing (CN)

(72) Inventors: Hairong Qian, Beijing (CN); Zhuo Li, Beijing (CN)

(73) Assignee: SG MICRO CORP, Beijing (CN)

(*) Notice: Subject to any disclaimer, the term of this patent is extended or adjusted under 35 U.S.C. 154(b) by 124 days.

(21) Appl. No.: 18/250,563

(22) PCT Filed: Oct. 21, 2021

(86) PCT No.: PCT/CN2021/125337
§ 371 (c)(1),
(2) Date: Apr. 26, 2023

(87) PCT Pub. No.: WO2022/089301
PCT Pub. Date: May 5, 2022

(65) Prior Publication Data
US 2023/0408592 A1 Dec. 21, 2023

(30) Foreign Application Priority Data
Oct. 27, 2020 (CN) .......................... 202011163786.0

(51) Int. Cl.
G01R 31/3842 (2019.01)
G01R 31/374 (2019.01)
(52) U.S. Cl.
CPC ....... *G01R 31/3842* (2019.01); *G01R 31/374* (2019.01)

(58) Field of Classification Search
None
See application file for complete search history.

(56) References Cited

U.S. PATENT DOCUMENTS

2015/0198666 A1\* 7/2015 Edwards ................ H03K 17/18
324/415

FOREIGN PATENT DOCUMENTS

| CN | 101442561 A | 5/2009 |
| CN | 103424699 A | 12/2013 |
| CN | 103885429 A | 6/2014 |

(Continued)

OTHER PUBLICATIONS

International Search Report and Written Opinion for International Application No. PCT/CN2021/125337, dated Jan. 19, 2022, 12 pages.

*Primary Examiner* — Jas A Sanghera
(74) *Attorney, Agent, or Firm* — Westman, Champlin & Koehler, P.A.

(57) ABSTRACT

A battery protection chip, a polling detection method and a polling detection circuit based on a battery protection chip are provided. The circuit includes: a polling signal generator generating first and second selection signals based on a basic clock signal, a plurality of state signals and a priority of a plurality of detection items. An input array selector selects one of a plurality of reference signals and one of a plurality of feedback signals to output to a comparator based on the first selection signal; the comparator compares the feedback reference signals and outputs an indication signal. An output sampler samples the indication signal according to the second selection signal and updates the plurality of state signals according to a sampling result.

20 Claims, 4 Drawing Sheets

(56) References Cited

FOREIGN PATENT DOCUMENTS

| | | | |
|---|---|---|---|
| CN | 106199447 | A | 12/2016 |
| CN | 106789445 | A | 5/2017 |
| CN | 109446023 | A | 3/2019 |
| CN | 109765493 | A | 5/2019 |
| CN | 113625541 | A | 11/2021 |
| CN | 114487761 | A | 5/2022 |
| CN | 114498567 | A | 5/2022 |
| WO | 2012085562 | A1 | 6/2012 |

* cited by examiner

BATTERY PROTECTION CHIP, POLLING DETECTION CIRCUIT AND METHOD BASED ON BATTERY PROTECTION CHIP

CROSS-REFERENCE TO RELATED APPLICATION

The present application is a Section 371 National Stage application of International Application No. PCT/CN2021/125337, filed on 21 Oct. 2021, which published as WO/2022/089301, on 5 May 2020, not in English, and claims priority to the Chinese Patent Application No. 202011163786.0, filed with the China National Intellectual Property Administration on 27 Oct. 2020, entitled "battery protection chip, polling detection circuit and method based on battery protection chip", the contents of which are incorporated herein by reference in their entireties.

FIELD OF TECHNOLOGY

The present disclosure relates to a field of battery technology, and in particular, to a battery protection chip, a polling detection method and a polling detection circuit based on a battery protection chip.

DESCRIPTION OF THE RELATED ART

With continuous development and wide-spread of mobile terminals, a battery is becoming more and more important as a power supply component of a mobile terminal. Therefore, how to adopt corresponding measures to protect the battery when the mobile terminal has a fault also directly affects a stability of the mobile terminal.

An existing battery protection technology generally monitors an electrical parameter of a circuit where the battery is located in real time, such as monitoring a current value, a voltage value, an instantaneous power and other electrical parameters of the circuit in real time. However, in this method, detection items need to be traversed and polled at a constant interval, and some polling in some cases has no practical significance, so that power consumption and polling resources are wasted; with increase of items to be detected, waste of the power consumption and the polling resource caused by this polling method are more obvious.

Therefore, there is a need to provide an improved technical solution to overcome above technical problems in a prior art.

SUMMARY

In view of above problems, the present disclosure provides a battery protection chip, a polling detection method and a polling detection circuit based on a battery protection chip, wherein polling detection is performed based on a priority of a plurality of detection items, thus, in a certain long polling cycle, time and resource of effective polling detection are capable of being allocated as needed, so that polling efficiency of a key performance parameter can be improved on a basis of ensuring polling timeliness.

In an aspect, a polling detection circuit based on a battery protection chip according to the present disclosure is provided and comprises: a polling signal generator, for receiving a basic clock signal and a plurality of state signals each representing a trigger state of a corresponding one of a plurality of detection items of the battery protection chip, and generating a first selection signal and a second selection signal based on the basic clock signal, the plurality of state signals and a priority of the plurality of detection items, wherein the first selection signal and the second selection signal represent a same item to be detected in a next polling detection validity period; an input array selector, connected to the polling signal generator, for receiving a plurality of reference signals and a plurality of feedback signals corresponding to the plurality of detection items, and selecting one of the plurality of reference signals and one of the plurality of feedback signals to output based on the first selection signal; a comparator, connected to the input array selector, for performing comparison between the feedback signal and the reference signal that are received by the comparator, and outputting an indication signal correspondingly; and an output sampler, respectively connected with the comparator and the polling signal generator, to receive the second selection signal and the indication signal, for obtaining a sampling result by sampling the indication signal according to the second selection signal and updating the plurality of state signals according to the sampling result.

Optionally, the polling signal generator comprises: a polling clock generating unit, for receiving the basic clock signal and generating a plurality of polling clock signals, a plurality of enable signals and a reference clock signal based on the basic clock signal; a polling object selecting unit, connected to the polling clock generating unit, for receiving the plurality of polling clock signals, the plurality of state signals, and one or more first enable signals in the plurality of enable signals, and detecting the plurality of state signals based on the plurality of polling clock signals, the one or more first enable signals, and the priority of the plurality of detection items, so as to generate the first selection signal according to a detection result; a detection enabling unit, respectively connected to the polling clock generating unit and the polling object selecting unit, for generating the second selection signal based on a second enable signal in the plurality of enable signals, the first selection signal, and the reference clock signal.

Optionally, the plurality of polling clock signals comprises: a first polling clock signal for triggering generation of a reference voltage in a validity period; a second polling clock signal for triggering detection of a state signal corresponding to a first type of detection item of the plurality of detection items according to the priority in a validity period; a third polling clock signal for triggering alternating detection of a state signal corresponding to a second type of detection item in the plurality of detection items according to the priority in a validity period.

Optionally, a time length of the validity period in each cycle of the first polling clock signal is equal to a sum of a time length of a preset delay period, a time length of the validity period in one cycle of the second polling clock signal, and a time length of the validity period in one cycle of the third polling clock signal.

Optionally, the polling object selecting unit comprises: a first priority processing subunit, for receiving the state signal corresponding to the first type of detection item, detecting the state signal corresponding to the first type of detection item in the validity period of the second polling clock signal according to the priority and the reference voltage, and generating the first selection signal according to a corresponding detection result; a second priority processing subunit, for receiving the state signal corresponding to the second type of detection item, detecting the state signal corresponding to the second type of detection item in the validity period of the third polling clock signal according to the priority and the reference voltage, and generating the first selection signal according to a corresponding detection result; a counting and clock adjusting subunit, for obtaining a count value by performing counting on a number of cycles of the second polling clock signal, and restarting the counting when the count value reaches a threshold which indicates that one detection large cycle is completed, so as to implement adjustment on the time length of the preset delay period and the threshold, wherein the validity period of the third polling clock signal is after the validity period of the second polling clock signal.

Optionally, the circuit further comprises: a storage module, connected with the output sampler, for latching the state signal corresponding to the first type of detection item after a preset time length.

Optionally, the preset time length is equal to a sum of a plurality of cycles of the second polling clock signals, and the time length of the preset delay period is equal to a time length of the one detection large cycle.

Optionally, the first type of detection item comprises a plurality of voltage threshold detection items and a plurality of temperature detection items, and the second type of detection item comprises a plurality of current threshold detection items.

Optionally, performing detection of the plurality of voltage threshold detection items and the plurality of temperature detection items in an initial detection large cycle is to perform detection in turn according to the priority, and performing detection in each non-initial detection large cycle is to perform detection by selecting a part of detection items according to a latch result of a previous detection large cycle.

In another aspect, a battery protection chip according to the present disclosure is provided and comprises: the polling detection circuit based on the battery protection chip as mentioned above, for performing polling detection on the plurality of detection items according to priority of the plurality of detection items, and generating a plurality of state signals according to a result of the polling detection; and a protection circuit, connected to the polling detection circuit based on the battery protection chip, for controlling on and off of a battery charging and discharging path according to the plurality of state signals.

In another aspect, a polling detection method based on a battery protection chip according to the present disclosure is provided, the polling detection method is applicable to the polling detection circuit based on the battery protection chip as mentioned above and the method comprises: generating a first selection signal and a second selection signal based on a basic clock signal, a plurality of state signals and a priority of the plurality of detection items, wherein the first selection signal and the second selection signal represent a same item to be detected in a next polling detection validity period; selecting one of a plurality of reference signals corresponding to the plurality of detection items and one of a plurality of feedback signals based on the first selection signal for comparison to obtain a comparison result; and obtaining a sampling result by sampling the comparison result according to the second selection signal, and updating the plurality of state signals according to the sampling result.

Optionally, the plurality of detection items comprise a first type of detection items and a second type of detection items, the first type of detection items comprise a plurality of voltage threshold detection items and a plurality of temperature detection items, and the second type of detection items comprise a plurality of current threshold detection items.

Optionally, generating the first selection signal and the second selection signal based on the basic clock signal, the plurality of state signals and the priority of the plurality of detection items comprises: generating a plurality of polling clock signals, a plurality of enable signals and a reference clock signal based on the basic clock signal; triggering generation of a reference voltage in a validity period of a first polling clock signal among the plurality of polling clock signals; detecting a state signal corresponding to the first type of detection item in a validity period of a second polling clock signal among the plurality of polling clock signals according to the priority, and generating the first selection signal according to a corresponding detection result; detecting a state signal corresponding to the second type of detection item in a validity period of a third polling clock signal among the plurality of polling clock signals according to the priority, and generating the first selection signal according to a corresponding detection result; generating the second selection signal according to the first selection signal, the reference clock signal, and a second enable signal among the plurality of enable signals, wherein a time length of the validity period in each cycle of the first polling clock signal is equal to a sum of a time length of a preset delay period, a time length of the validity period in one cycle of the second polling clock signal, and a time length of the validity period in one cycle of the third polling clock signal.

Optionally, detecting the state signal corresponding to the first type of detection item in the validity period of the second polling clock signal among the plurality of polling clock signals according to the priority comprises: obtaining a count value by performing counting on a number of cycles of the second polling clock signal, and restarting the counting once the count value reaches a threshold, which indicates that one detection large cycle is completed; detecting the state signal corresponding to the first type of detection item in turn according to the priority in an initial detection large cycle; selecting a part of detection item in the first type of detection item for detection according to a detection result of a previous detection large cycle in each non-initial detection large cycle.

Optionally, the plurality of voltage threshold detection items comprises a lowest charging and discharging voltage threshold detection item, an overvoltage threshold detection item, and an undervoltage threshold detection item; the plurality of temperature detection items comprises a lowest protection temperature detection item, a highest protection temperature detection item, a first intermediate temperature detection item and a second intermediate temperature detection item, wherein a first intermediate temperature corresponding to the first intermediate temperature detection item is lower than a second intermediate temperature corresponding to the second intermediate temperature detection item.

Optionally, a priority of the lowest charging and discharging voltage threshold detection item is higher than a priority of the lowest protection temperature detection item, the priority of the lowest protection temperature detection item is higher than a priority of the highest protection temperature detection item, the priority of the highest protection temperature detection item is higher than a priority of the first intermediate temperature detection item, the priority of the first intermediate temperature detection item is higher than a priority of the second intermediate temperature detection item, and the priority of the second intermediate temperature detection item is higher than priorities of the overvoltage threshold detection item and the undervoltage threshold detection item.

Optionally, in the initial detection large cycle, when the state signal of any one of the lowest charging and discharging voltage threshold detection item, the overvoltage threshold detection item, the undervoltage threshold detection item, the lowest protection temperature detection item and the highest protection temperature detection item is detected to be in a triggered state, a corresponding current triggered item is continuously detected until the triggered state is released or the count value reaches the threshold; or in the initial detection large cycle, when the state signal of any one of the first intermediate temperature detection item and the second intermediate temperature detection item is detected to be in the triggered state, only the undervoltage threshold detection item is detected until the triggered state is released or the count value reaches the threshold.

Optionally, selecting the part of detection item in the first type of detection item for detection according to the detection result of the previous detection large cycle in each non-initial detection large cycle comprises: if the undervoltage threshold detection item in the detection result of the previous detection large cycle is in a triggered state, detecting the lowest charging and discharging voltage threshold detection item, and otherwise, detecting the undervoltage threshold detection item; if the lowest protection temperature detection item is in a triggered state or the second intermediate temperature detection item is in the triggered state in the detection result of the previous detection large cycle, detecting the lowest protection temperature detection, and otherwise, detecting the overvoltage threshold detection item; if the second intermediate temperature detection item is in the triggered state or the highest protection temperature detection item is in the triggered state in the detection result of the previous detection large cycle, detecting the highest protection temperature detection item, and otherwise, detecting the undervoltage threshold detection item; if the first intermediate temperature detection item is in a triggered state or the plurality of temperature detection items are in an non-triggered state in the detection result of the previous detection large cycle, detecting the first intermediate temperature detection item, and if the lowest protection temperature detection item is in a triggered state or the second intermediate temperature detection item is in a triggered state in the detection result of the previous detection large cycle, detecting the undervoltage threshold detection item; if the plurality of temperature detection items are all in an non-triggered state or the second intermediate temperature detection item is in a triggered state in the detection result of the previous detection large cycle, detecting the second intermediate temperature detection item, and if the highest protection temperature detection item is in a triggered state or the lowest protection temperature detection item is in a triggered state or the first intermediate temperature detection item is in a triggered state, detecting the under-voltage threshold detection item; performing alternating detection on the overvoltage threshold detection item and the undervoltage threshold detection item, and when any one of the overvoltage threshold detection item and the undervoltage threshold detection item is detected to be in the triggered state, continuously detecting a corresponding current triggered item until the triggered state is released, and recovering the alternating detection.

Optionally, detecting the state signal corresponding to the second type of detection item in the validity period of the third polling clock signal among the plurality of polling clock signals according to the priority comprises: performing alternating detection on the state signals of the plurality of current threshold detection items in the validity period of the third polling clock signal, and when the state signal corresponding to a certain detection item in the state signals of the plurality of current threshold detection items is detected to be in a triggered state, continuously detecting a corresponding current triggered item until the triggered state is released, and recovering the alternating detection.

Optionally, a current detection result is latched after each detection large cycle is completed.

The present disclosure has following beneficial effects: the present disclosure discloses a battery protection chip, and a polling detection circuit and a polling detection method based on a battery protection chip, the polling signal generator is adopted to determine an item to be detected in the validity period of next polling detection based on the priorities of the basic clock signal, the plurality of state signals and the plurality of detection items, and meanwhile, the plurality of state signals are continuously updated according to a determined item to be detected, so that the priority and combined judgment may be made according to the self-characteristics and a mutual condition relation of different items to be detected and a circuit state and a current state of a previous polling cycle (corresponding to a previous detection large cycle), which is help to allocate time and resource of effective polling detection as needed in a certain long polling cycle, so that a polling efficiency of key performance parameters is improved on a basis of ensuring a polling timeliness, and waste of polling resources is also effectively reduced.

The plurality of polling clock signals are adopted as window signals to respectively trigger process performed on the reference voltage, the voltage threshold, the temperature detection item and the current threshold detection item, so that mutual interference is capable of being avoided, and detection accuracy and the polling efficiency are improved. And the energy loss is capable of being reduced by performing process only in the validity period of the polling signal.

After one detection large cycle is completed, various detection results, namely state signals, are latched, so that a basis is provided for judging priority of a next detection large cycle, and a negative effect of detection result loss on subsequent polling detection is avoided.

Selective detection is performed on the plurality of detection items including the plurality of voltage threshold detection items and the plurality of temperature detection items by respectively adopting different priority processing modes in the initial detection large cycle and the non-initial detection large cycle, so that a temperature signal which changes slowly is capable of being polled in a large cycle with basis, and a signal which changes relatively quickly is capable of being polled more efficiently in a small cycle, polling resources is utilized more reasonably, and power consumption of polling is effectively reduced.

When polling detection is being performed, if a certain detection item is detected to be in a triggered state, this triggered item is continuously and uninterruptedly detected, so that sensitivity and state recovery speed of the circuit is capable of being improved effectively.

It is to be understood that both foregoing general description and following detailed description are exemplary and explanatory only and are not restrictive of the present disclosure.

BRIEF DESCRIPTION OF THE DRAWINGS

The above and other objects, features, and advantages of the present disclosure will be clearer through the description of embodiments of the present disclosure with reference to the accompanying drawings.

DETAILED DESCRIPTION OF EMBODIMENTS OF THE DISCLOSURE

Figure 1:
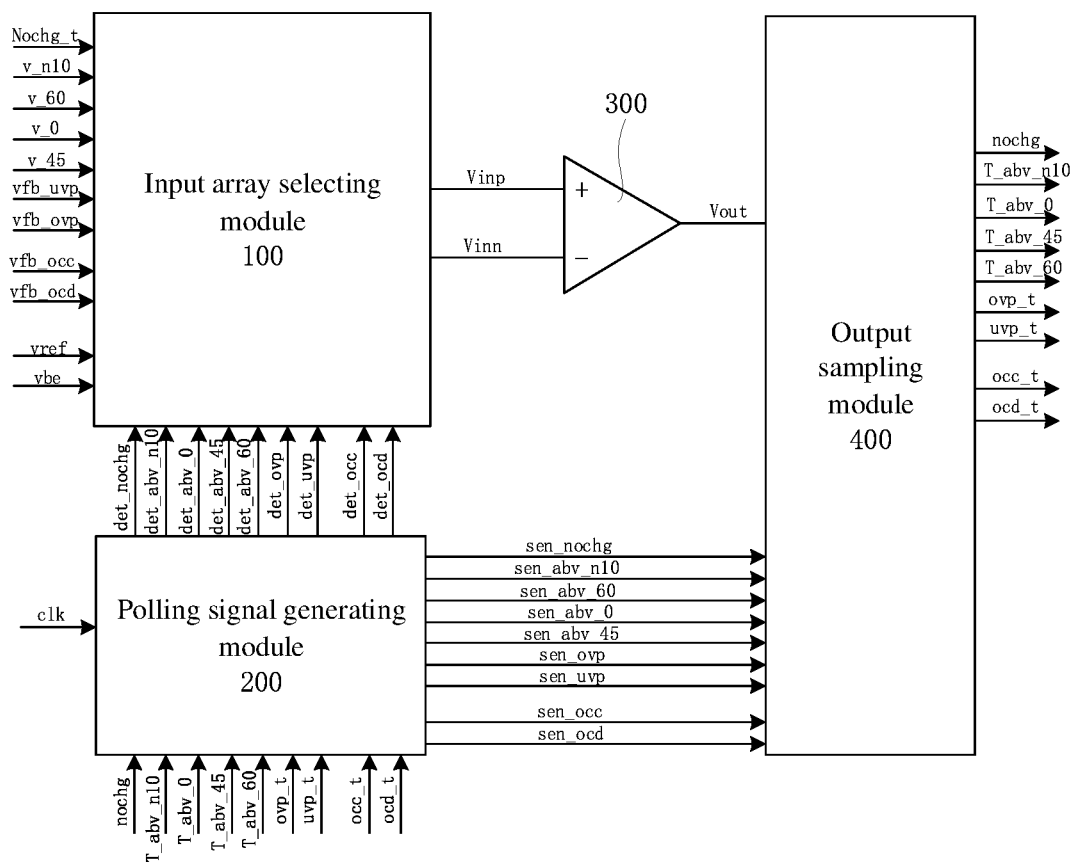
FIG. 1 shows a structural block diagram of a polling detection circuit based on a battery protection chip provided according to an embodiment of the present disclosure.

To facilitate an understanding of the present disclosure, the present disclosure will now be described more fully with reference to accompanying drawings. Preferred embodiments of the present disclosure are shown in the drawings. The present disclosure may, however, be embodied in different forms and should not be construed as limited to the embodiments set forth herein. Rather, these embodiments are provided so that this disclosure will be thorough and complete.

Unless defined otherwise, all technical and scientific items used herein have the same meaning as commonly understood by one of ordinary skill in the art to which this present disclosure belongs. The terminology used herein in the description of the present disclosure is for the purpose of describing particular embodiments only and is not intended to be limiting of the present disclosure.

The present disclosure will be described in detail below with reference to the accompanying drawings.

Figure 2:
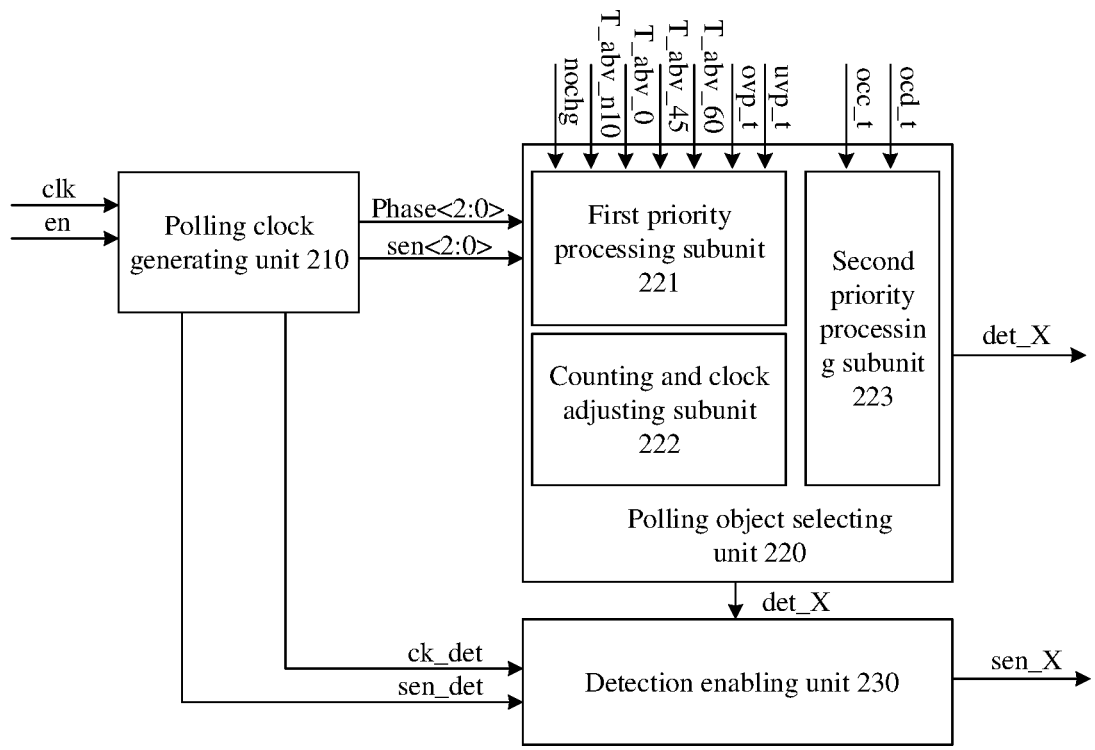
FIG. 2 shows a structural block diagram of a polling signal generator in a polling detection circuit provided according to an embodiment of the present disclosure.
Figure 3:
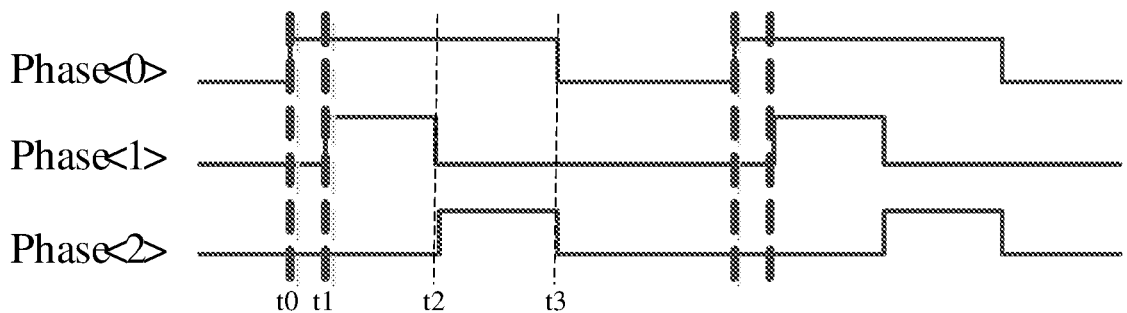
FIG. 3 shows a timing waveform diagram of a polling detection circuit based on a battery protection chip provided according to an embodiment of the present disclosure.

FIG. 1 shows a structural block diagram of a polling detection circuit based on a battery protection chip provided according to an embodiment of the present disclosure, FIG. 2 shows a structural block diagram of a polling signal generator in a polling detection circuit provided according to an embodiment of the present disclosure, FIG. 3 shows a timing waveform diagram of a polling detection circuit based on a battery protection chip provided according to an embodiment of the present disclosure.

In this embodiment, as shown in FIG. 1, a polling detection circuit based on a battery protection chip (hereinafter, simply referred to as a polling detection circuit) includes: an input array selector 100, a polling signal generator 200, a comparator 300, and an output sampler 400. A first input terminal of the input array selector 100 receives a plurality of reference signals and a plurality of feedback signals corresponding to a plurality of detection items, a second input terminal of the input array selector 100 is connected to a first output terminal of the polling signal generator 200, and an output terminal of the input array selector 100 is connected to an input terminal of the comparator 300. A first input terminal of the polling signal generator 200 receives a basic clock signal clk, a second input terminal of the polling signal generator 200 receives a plurality of state signals representing a trigger state of each detection item in a plurality of detection items of the battery protection chip, and a second output terminal of the polling signal generator 200 is connected to a second input terminal of the output sampler 400. A first input of the output sampler 400 is connected to an output of the comparator 300, and an output of the output sampler 400 is directly or indirectly connected to the second input terminal of the polling signal generator 200.

In this embodiment, the plurality of detection items of the battery protection chip include a first type of detection items and a second type of detection items. The first type of detection items include a plurality of voltage threshold detection items and a plurality of temperature detection items, and the second type of detection items include a plurality of current threshold detection items.

Specifically, the plurality of voltage threshold detection items include: a lowest charging and discharging voltage threshold detection item Nochg (for determining whether a current battery voltage is lower than a lowest allowable operating charging and discharging voltage, and when the battery voltage is lower than the lowest allowable charging and discharging voltage, the circuit turns off a main transmission transistor, and enters a charge and discharge prohibition mode), an overvoltage threshold detection item ovp (for determining whether the battery voltage exceeds a highest allowable voltage in a normal temperature operating state), and an undervoltage threshold detection item uvp (for determining whether the battery voltage is lower than a lowest allowable voltage in the normal temperature operating state).

The plurality of temperature detection items include: a lowest protection temperature detection item v_n10 (for comparing a current chip temperature with a lowest protection temperature (e.g., minus 10° C.), when the current chip temperature is lower than the lowest protection temperature, the circuit turns off the main transmission transistor, and enters the charge and discharge prohibition mode), a highest protection temperature detection item v_60 (for comparing the current chip temperature with a highest protection temperature, e.g., 60° C. above zero), when the current chip temperature is higher than the highest protection temperature, the circuit turns off the main transmission transistor, and enters the charge and discharge prohibition mode), a first intermediate temperature detection item v_0 (for comparing the current chip temperature with a first intermediate temperature (e.g., 0° C.), when the current chip temperature is between the first intermediate temperature and the lowest protection temperature (e.g., 0° C. to minus 10° C.), the circuit allows discharging and prohibits charging), and a second intermediate temperature detection item v_45 (for comparing the current chip temperature with a second intermediate temperature (such as 45° C.), and when the current chip temperature is between the second intermediate temperature and the highest protection temperature (such as 45° C. to 60° C.), the circuit allows discharging and prohibits charging).

The plurality of current threshold detection items include: a highest charging current threshold detection item occ (for determining whether a charging current is higher than a highest allowable charging current in the normal temperature operating state) and a highest discharging current threshold detection item ocd (for determining whether the discharging current is lower than a highest allowable discharging current in the normal temperature operating state). Performing polling detection after the plurality of detection items are classified, so that mutual interference may be avoided, and a detection accuracy and a polling efficiency are improved. It should be understood that above numerical examples in the present embodiment are only for convenience of understanding and are not to be construed as limiting technical solutions of the present disclosure. In practice, above values of different battery protection chips may be other values, and may be the same or different, and are not described herein too much.

It is understood that above description of types, numbers and related threshold ranges of the plurality of detection items are only exemplary, and the technical solution of the present disclosure is applicable to, but not limited to, the plurality of voltage threshold detection items, the plurality of protection temperature detection items and the plurality of current threshold detection items described above, and may also include several detection items such as power, time and the like, as long as it is satisfied that the detection item that changes slowly with time is detected on the basis of a large cycle which is longer, and the detection item that changes quickly with time is detected on the basis of a small cycle which is shorter, which are all in protection scope of the present disclosure. Meanwhile, the types and the numbers of the basic detection items included in the various types of detection items described herein are not limited thereto, and the present disclosure is not particularly limited thereto.

It should be noted that, the above descriptions of temperature values in the protection temperature detection items are also only exemplary, and in practice, a range of detected values is different for different chips and different application environments, and the present disclosure is not limited thereto.

Further, the polling signal generator 200 is configured for generating a first selection signal and a second selection signal based on the basic clock signal clk, the plurality of state signals, and a priority of the plurality of detection items. Optionally, the first selection signal is labeled as a det signal, and the second selection signal is labeled as a sen signal. That is, the polling signal generator 200 selects one of the det signals corresponding to the plurality of detection items as the first selection signal to be output, and simultaneously selects one of the sen signals corresponding to the plurality of detection items to be output in each polling validity period, wherein the first selection signal and the second selection signal are both polling signals and are used for representing a same item to be detected during a next polling detection validity period.

Further, the plurality of state signals includes: a state signal nochg corresponding to the lowest charging and discharging voltage threshold detection item, a state signal T_abv_n10 corresponding to the lowest protection temperature detection item, a state signal T_abv_0 corresponding to the first intermediate temperature detection item, a state signal T_abv_45 corresponding to a second intermediate temperature detection item, a state signal T_abv_60 corresponding to the highest protection temperature detection item, a state signal ovp_t corresponding to the overvoltage threshold detection item, a state signal uvp_t corresponding to the undervoltage threshold detection item, a state signal occ_t corresponding to the highest charging current threshold detection item, and a state signal ocd_t corresponding to a highest discharging current threshold detection item.

The det signals corresponding to the plurality of detection items include: a det_nochg signal corresponding to a first detection item Nochg, a det_ovp signal corresponding to a second detection item ovp, a det_uvp signal corresponding to a third detection item uvp, a det_abv_n10 signal corresponding to a fourth detection item v_n10, a det_abv_60 signal corresponding to a fifth detection item v_60, a det_abv_0 signal corresponding to a sixth detection item v_0, a det_abv_45 signal corresponding to a seventh detection item v_45, a det_occ signal corresponding to an eighth detection item occ, and a det_ocd signal corresponding to a ninth detection item ocd.

The sen signals corresponding to the plurality of detection items include: a sen_Nochg signal corresponding to the first detection item Nochg, a sen_ovp signal corresponding to the second detection item ovp, a sen_uvp signal corresponding to the third detection item uvp, a sen_abv_n10 signal corresponding to the fourth detection item v_n10, a sen_abv_60 signal corresponding to the fifth detection item v_60, a sen_abv_0 signal corresponding to the sixth detection item v_0, a sen_abv_45 signal corresponding to the seventh detection item v_45, a sen_occ signal corresponding to the eighth detection item occ, and a sen_ocd signal corresponding to the ninth detection item ocd.

Referring to FIGS. 2 and 3, in the present embodiment, the polling signal generator 200 includes: a polling clock generating unit 210, a polling object selecting unit 220, and a detection enabling unit 230.

The input terminal of the polling clock generating unit 210 receives the basic clock signal clk and the basic enable signal en, and is configured for generating a plurality of polling clock signals Phase<2:0>, a plurality of enable signals and a reference clock signal ck_det based on the basic clock signal clk and the basic enable signal en.

Referring to FIG. 3, the plurality of polling clock signals Phase<2:0> include a first polling clock signal Phase<0>, a second polling clock signal Phase<1>, and a third polling clock signal Phase<2>. The first polling clock signal Phase<0> is used for triggering generation of a reference voltage in a validity period by, such as, a bandgap reference circuit; the second polling clock signal Phase<1> is used for triggering detection of a state signal corresponding to the first type of detection items of the plurality of detection items according to the priority in a validity period; the third polling clock signal Phase<2> is used for triggering alternating detection of a state signal corresponding to the second type of detection items in the plurality of detection items according to the priority in a validity period. Meanwhile, the plurality of enable signals include one or more first enable signals sen <2:0> and a second enable signal sen_det, and the one or more first enable signals sen <2:0> are used for respectively controlling on and off of each subunit in the polling object selecting unit 220. Optionally, in this embodiment, all of the polling clock signals Phase<2:0> are active in a high level.

Further, the second polling clock signal Phase<1> and the third polling clock signal Phase<2> are valid only during the validity period of the first polling clock signal Phase<0>, and a time length of the validity period (corresponding to a period between time t0 and time t3 in FIG. 3) in each cycle of the first polling clock signal Phase<0> is equal to a sum of a time length of a preset delay period (corresponding to a period between the time t0 and time t1 in FIG. 3), a time length of the validity period (corresponding to the period between the time t1 and the time t2 in FIG. 3) in one cycle of the second polling clock signal Phase<1>, and a time length of the validity period (corresponding to the period between the time t2 and the time t3 in FIG. 3) in one cycle of the third polling clock signal Phase<2>.

It should be understood that above-mentioned division of the plurality of polling clock signals is only exemplary, and in other embodiments of the present disclosure, the division may be further divided into, for example, including the first to fourth polling clock signals, and then performing polling detection of voltage class, temperature class, and current class during the validity period of the second to fourth polling clock signals, respectively; or, for example, the method may further include more polling clock signals, and then detect a detection item in the validity period of each polling clock signal, etc., as long as the relationship between the polling clock signals and the detection items is the same as or similar to the priority processing method disclosed in the present disclosure, which is in the protection scope of the present disclosure. Correspondingly, the time length of the validity period of each cycle of the first polling clock signal for triggering generation of the reference voltage in the plurality of polling clock signals is equal to the sum of the time lengths of the validity periods of all the remaining polling clock signals in one cycle.

Furthermore, the validity period of the third polling clock signal Phase<2> is after the validity period of the second polling clock signal Phase<1>, that is, a rising edge of the third polling clock signal Phase<2> is at the same time as a falling edge of the second polling clock signal Phase<1> or is after the falling edge of the second polling clock signal Phase<1>. In the present embodiment, the rising edge of the third polling clock signal Phase<2> and the falling edge of the second polling clock signal Phase<1> are only explained as an example.

At time to, the first polling clock signal Phase<O> triggers an internal bandgap reference circuit to generate the reference voltage, and since the bandgap reference circuit needs a certain setup time to turn on, after waiting for the preset delay period, i.e., at time t1, the second polling clock signal Phase<1> is controlled to be effective, and at time t2, the third polling clock signal Phase<2> is controlled to be effective, so as to turn on a corresponding first detection window and second detection window in sequence. After a current polling detection is finished, the bandgap reference circuit and a detection circuit are turned off, and after a certain polling interval time, a next polling is started. In this way, controlling the internal bandgap reference circuit to generate the reference voltage at intervals only during the validity period of the first polling clock signal Phase<0>, and the polling detection of each detection item is performed during this period, which helps to reduce energy consumption.

In the present disclosure, several cycles of the second polling clock signals Phase<1> is referred to as one detection large cycle. And each high level period of the second polling clock signal Phase<1> and each high level period of the third polling clock signal Phase<2> is a polling detection validity period.

A first input terminal of the polling object selecting unit 220 is connected to an output terminal of the polling clock generating unit 210 to receive the plurality of polling clock signals Phase<2:0> and the one or more first enable signals sen <2:0> of the plurality of enable signals, a second input terminal of the polling object selecting unit 220 receives the plurality of state signals corresponding to the plurality of detection items, and the polling object selecting unit 220 is configured for detecting the plurality of state signals based on the plurality of polling clock signals Phase<2:0>, the one or more first enable signals sen <2:0> and the priorities of the plurality of detection items, so as to generate the first selection signal det_X according to a detection result. Wherein X represents one of the plurality of detection items.

Further, the polling object selecting unit 220 includes a first priority processing subunit 221, a counting and clock adjusting subunit 222, and a second priority processing subunit 223. The first priority processing subunit 221 receives the state signal corresponding to the first type of detection items, and is configured for detecting the state signal corresponding to the first type of detection items in the validity period of the second polling clock signal Phase<1> according to the priority and the reference voltage, and generating the first selection signal det_X according to a corresponding detection result.

In this embodiment, when one of the one or more first enable signals sen <2:0> controls the first priority processing subunit 221 to turn on, the first priority processing subunit 221 performs polling detection on the first type of detection items of the battery protection chip (or circuit) with the several cycles of the second polling clock signal Phase<1> as the detection large cycle. In each detection large cycle, taking one cycle of the second polling clock signal Phase<1> as a unit, and in a high level period in each cycle of the second polling clock signal Phase<1>, a detection result (namely, a state signal corresponding to the first type of detection items after a previous detection large cycle) of the previous detection large cycle is sequentially compared with the reference voltage according to the priority of the first type of detection items (or the state signal corresponding to the first type of detection items) to detect and recognize a trigger state of the first type of detection items in the previous detection large cycle, and one of the first type of detection items is further selected as an item to be detected according to a corresponding recognition result, and outputting the det signal corresponding to the item as the first selection signal det_X.

Further, in an initial detection large cycle after the circuit is initialized (it may be assumed that all detection items before the circuit is initialized are in an non-triggered state), the det_nochg signal, the det_abv_n10 signal, the det_abv_60 signal, the det_abv_0 signal, and the det_abv_45 signal are sequentially output as the first selection signal det_X mainly according to priority (the detection item corresponding to the output first selection signal det_X is recorded as the item to be detected). After the first selection signal det_X is output, the input array selector 100, the comparator 300, and the output sampler 400 perform detection and comparison on signal parameters in the battery protection chip (or circuit) corresponding to the item to be detected based on the first selection signal det_X output by the polling signal generator 200, so as to obtain a state signal corresponding to the item to be detected in a current detection large cycle, and transmit the state signal to the first priority processing subunit 221 to recognize a trigger status of the item to be detected. When the item to be detected is recognized to be in a triggered state, a same first selection signal det_X in a following cycle of the second polling clock signal Phase<1> is continuously output so as to continuously detect the item to be detected until the triggered state is released or the current detection large cycle is finished; and when the item to be detected is recognized to be in a non-triggered state, a next det signal is sequentially output as the first selection signal det_X. Further, after the detection item corresponding to the det_abv_45 signal is recognized to be in the non-triggered state, the det_ovp signal and the det_uvp signal are alternately output as the first selection signal det_X in the following cycle of the second polling clock signal Phase<1>, and similarly, when the detection item corresponding to the det_ovp signal or the det_uvp signal is recognized to be in the triggered state, a same first selection signal det_X is continuously output in the following cycle of the second polling clock signal Phase<1> to continuously detect the item to be detected until the triggered state is released or the current detection large cycle is ended.

In each subsequent non-initial detection large cycle, the detection of the first type of detection items (or the state signal corresponding to the first type of detection items) mainly selects a part of detection items to detect according to a detection result of the previous detection large cycle. After a new round of non-initial detection large cycle is started, firstly, the state signal of the undervoltage threshold detection item uvp in the previous detection large cycle is recognized and detected based on the reference voltage, and the det_nochg signal or the det_uvp signal is selected to be output as the first selection signal det_X according to the trigger state of the undervoltage threshold detection item uvp; then, respectively recognizing and detecting the state signals of the protection temperature detection items in the previous detection large cycle based on the reference voltage, so as to select two of the det_abv_n10 signal, the det_abv_60 signal, the det_abv_0 signal and the det_abv_45 signal according to the state signals of the protection temperature detection items (to further determine the triggered states of the protection temperature detection items in the current detection large cycle, update the corresponding state signals), the det_ovp signal and the det_uvp signal to be respectively output as the first selection signal det_X in a small cycle (one small cycle corresponds to one cycle of the second polling clock signal Phase<1>); and finally alternately outputting the det_ovp signal and the det_uvp signal as the first selection signal det_X in the remaining small cycle of the current initial detection large cycle. Meanwhile, the same as the initial detection large cycle, when the detection item corresponding to the output first selection signal det_X is recognized to be in the triggered state, the same first selection signal det_X is continuously output in the following cycle of the second polling clock signal Phase<1> to continuously detect the item to be detected until the triggered state is released or the current detection large cycle is finished.

In summary, according to above intelligent polling manner and a priority determination manner in the validity period of the second polling clock signal Phase<1>, the temperature signal changing slowly is capable of being polled in a large cycle with basis, the voltage signal changing relatively quickly is capable of being polled more efficiently in a small cycle, polling resources is capable of being utilized more reasonably, and the polling power consumption is effectively reduced. In addition, continuous and uninterrupted detection of a certain triggered item may improve a sensitivity and a state recovery speed of the circuit effectively.

The second priority processing subunit 223 receives the state signal corresponding to the second type of detection items, and is configured for detecting the state signal corresponding to the second type of detection items in the validity period of the third polling clock signal Phase<2> according to the priority and the reference voltage, and generating the first selection signal det_X according to the corresponding detection result.

After the third polling clock signal Phase<2> is turned on, the det_occ signal and the det_ocd signal are output alternately as the first selection signal det_X during the validity period of the third polling clock signal Phase<2> (that is, the priority of the highest charging current threshold detection item occ and the priority of the highest discharging current threshold detection item ocd may be regarded to have a same level relationship). It should be understood that, during the high level of each cycle of the third polling clock signal Phase<2>, only one of the det_occ signal and the det_ocd signal is output, and when the detection item corresponding to the output first selection signal det_X is recognized to be in the triggered state in a certain period, the same first selection signal det_X is continuously output in the following cycle of the third polling clock signal Phase<2> to continuously detect this item to be detected until the triggered state is released, and a alternating detection state is recovered.

Based on above description, according to the priority, characteristics of different items to be detected, and mutual condition relationship, in combination with a circuit state and a current state of a previous polling cycle, in each cycle of the first polling clock signal Phase<0>, a combination including one of the first type of detection items and one of the second type of detection items is selected to be detected respectively, so as to allocate time and resource of effective polling detection as needed in a certain long polling cycle, so that a polling efficiency of key performance parameters is improved, and waste of polling resources is also effectively reduced The counting and clock adjusting subunit 222 is configured for obtaining a count value by performing counting on a number of cycles of the second polling clock signal, so as to restart the counting when the count value reaches the threshold which indicates that one detection large cycle is completed, and to implement adjustment on the time length of the preset delay period and the threshold.

In the embodiment of the present disclosure, referring to FIG. 3, an interval time of a rising edge of each first polling clock signal Phase<0> and a rising edge of each second polling clock signal Phase<1> (that is, the time length of the preset delay period, t0 to t1), and the number of cycles of the second polling clock signal Phase<1> included in each detection large cycle may be adjusted in real time by the counting and clock adjusting subunit 222, so as to improve applicability of the circuit.

The detection enabling unit 230 is respectively connected to the polling clock generating unit 210 and the polling object selecting unit 220, and is configured for generating the second selection signal sen_X based on the second enabling signal sen_det of the plurality of enabling signals, the first selection signal det_X, and the reference clock signal ck_det.

In this embodiment, when the polling object selecting unit 220 outputs the first selection signal det_X, the detection enabling unit 230 is triggered to output the second selection signal sen_X representing a same item to be detected. The second selection signal sen_X is used for triggering sampling of a detection result of a current item to be detected.

The input array selector 100 is configured for selecting one of the plurality of reference signals and one of the plurality of feedback signals to output based on the first selection signal.

Several corresponding sampling circuits are disposed in the battery protection chip (or circuit), and the several sampling circuits are configured to sample signal parameters of corresponding detection items of a battery, so as to obtain the plurality of feedback signals (including the feedback signal Nochg corresponding to the lowest charging and discharging voltage threshold detection item, the feedback signal v_n10 corresponding to the lowest protection temperature detection item, the feedback signal v_0 corresponding to the first intermediate temperature detection item, the feedback signal v_45 corresponding to the second intermediate temperature detection item, the feedback signal v_60 corresponding to the highest protection temperature detection item, the feedback signal vfb_ovp corresponding to an overvoltage threshold detection item, the feedback signal vfb_uvp corresponding to an undervoltage threshold detection item, the feedback signal vfb_occ corresponding to the highest charging current threshold detection item, and the feedback signal vfb_ocd corresponding to the highest discharging current threshold detection item) corresponding to the plurality of detection items. After receiving the first selection signal det_X, the input array selector 100 selects the feedback signal corresponding to the item to be detected based on the item to be detected corresponding to the first selection signal det_X and outputs the feedback signal.

Optionally, in the present disclosure, a number of sampling circuits in the battery protection chip (or circuit) is one, and the input array selector 100 is configured for triggering the sampling circuit to sample signal parameters (including, for example, a battery voltage and a battery temperature) of corresponding detection items of the battery based on the first selection signal det_X to obtain corresponding feedback signals. Therefore, detection resources are saved, and chip cost is reduced. Or, the number of the sampling circuits in the battery protection chip (or circuit) is multiple, and the input array selector 100 is configured for triggering one sampling circuit of a plurality of sampling circuits corresponding to the detection item to operate based on the first selection signal det_X to sample a corresponding signal parameter of the battery, so as to obtain a corresponding feedback signal. Therefore, detection resources are saved, and sampling accuracy is improved. Or, the number of the sampling circuits in the battery protection chip (or circuit) is multiple, the plurality of sampling circuits operate simultaneously and output the plurality of feedback signals, the input array selector 100 receives the plurality of feedback signals simultaneously, and selects one of the plurality of feedback signals to output based on the first selection signal det_X. Therefore, real-time sampling of chip parameters is achieved, a polling detection speed is increased, a protection strength of the chip is enhanced, and the sampling accuracy may also be improved.

The plurality of reference signals received by the input array selector 100 includes a first reference signal vref corresponding to the plurality of voltage threshold detection items and the plurality of current threshold detection items and a second reference signal vbe corresponding to the plurality of protection temperature detection items. The first reference signal vref may correspond to a voltage signal generated by a voltage divider circuit dividing a voltage of a node in the battery protection chip (or circuit), and the second reference signal vbe may correspond to a voltage signal across a diode (including but not limited to one) in the battery protection chip (or circuit).

The comparator 300 is configured to compare the feedback signal with the reference signal that is received and output a corresponding indication signal. The output terminal of the input array selector 100 outputs one of the plurality of reference signals (e.g., refer to Vinp) and one of the plurality of feedback signals (e.g., refer to Vinn), and the comparator 300 has a non-inverting input terminal and an inverting input terminal respectively receive the feedback signal Vinn and the reference signal Vinp output by the input array selector 100, and outputs an indication signal Vout after comparing voltages of the two signals, so as to represent the trigger state of the current item to be detected in the chip.

The output sampler 400 is configured for sampling the indication signal according to the second selection signal and update the plurality of state signals according to a corresponding sampling result.

The output sampler 400 receives the indication signal Vout and the second selection signal sen_X at the same time, and when the second selection signal sen_X changes to a high level, the output sampler 400 samples a level state of the indication signal Vout that is received, so as to obtain a state signal of the item to be detected in the validity period of the current polling detection. In each detection large cycle, the output sampler 400 repeats this operation to obtain the state signals corresponding to the plurality of detection items in the current detection large cycle, that is, to update the plurality of state signals in the previous detection large cycle.

In this disclosure, the polling detection circuit based on the battery protection chip further includes: a storage module. The storage module is connected to the output sampler 400, and is configured for latching the state signal corresponding to the first type of detection items after a preset duration to avoid data loss, and to base a polling priority determination in a next detection large cycle. The preset duration is equal to a sum of periods of the plurality of second polling clock signals Phase<1>, and the delay duration is equal to the time length of one detection large cycle.

It is understood that the plurality of state signals output by the output sampler 400 or a latch signal of the storage module are also output to a subsequent circuit of the battery protection chip, such as a protection circuit, to control and achieve a chip protection function.

Figure 4:
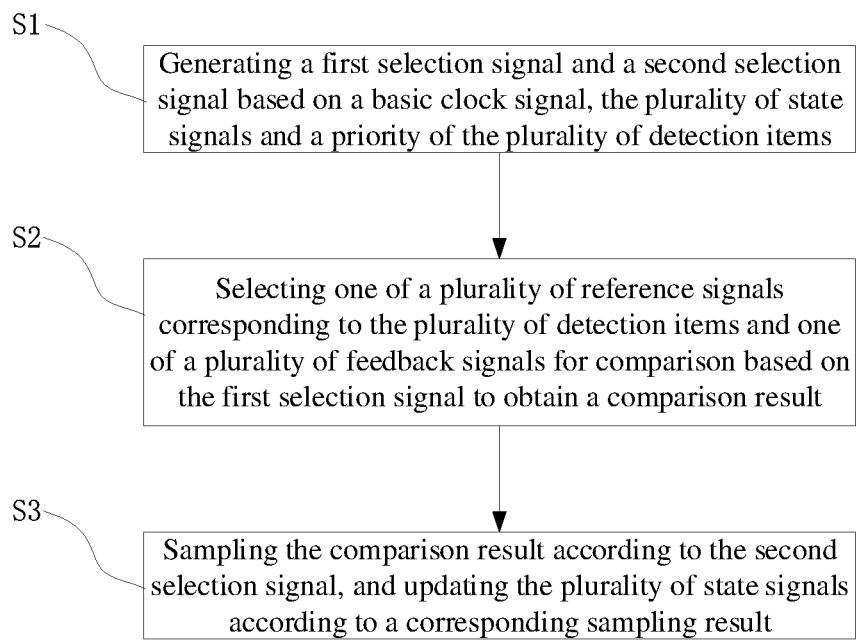
FIG. 4 shows a flow chart diagram of a polling detection method based on a battery protection chip provided according to an embodiment of the present disclosure.
Figure 5:
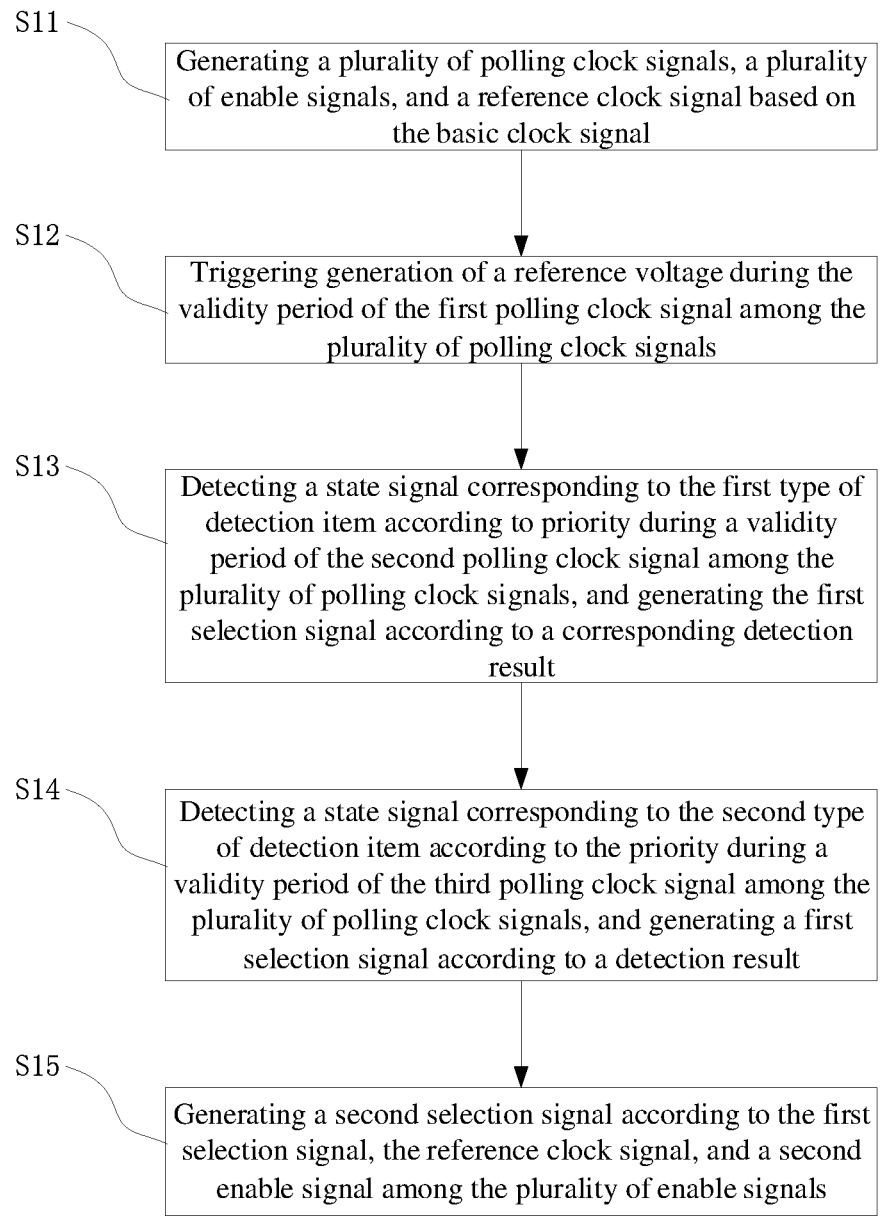
FIG. 5 shows a flow chart diagram of a method for generating a first selection signal and a second selection signal in a polling detection method provided according to an embodiment of the disclosure.

FIG. 4 shows a flow chart diagram of a polling detection method based on a battery protection chip provided according to an embodiment of the present disclosure, FIG. 5 shows a flow chart diagram of a method for generating a first selection signal and a second selection signal in a polling detection method provided according to an embodiment of the disclosure.

As shown in FIG. 4, in the present embodiment, a polling detection method based on a battery protection chip may be applied to the polling detection circuit based on the battery protection chip as described in FIGS. 1 to 3 above, and therefore, following description of the polling detection method may be understood based on the description of FIGS. 1 to 3 above. The method includes performing steps S1 to S3.

Specifically, in step S1, generating a first selection signal and a second selection signal based on a basic clock signal, the plurality of state signals and a priority of the plurality of detection items.

In the present embodiment, the first selection signal and the second selection signal represent a same item to be detected in a next polling detection validity period. And the plurality of detection items include a first type of detection items and a second type of detection items, wherein the first type of detection items include a plurality of voltage threshold detection items and a plurality of protection temperature detection items, and the second type of detection items include a plurality of current threshold detection items. For details, relevant descriptions mentioned above can be referred to, and further description is not repeated herein.

Further, as shown in FIG. 5, generating the first selection signal and the second selection signal based on the basic clock signal, the plurality of state signals, and the priority of the plurality of detection items includes performing steps S11 through S15. In step S11, generating a plurality of polling clock signals, a plurality of enable signals, and a reference clock signal based on the basic clock signal.

Operations such as frequency division and delay may be performed on the basic clock signal clk by the polling clock signal generating unit 210 to generate a plurality of polling clock signals (including first to third polling clock signals), a plurality of enable signals (including one or more first enable signals and second enable signals), and a reference clock signal.

In the plurality of polling clock signals, the second polling clock signal Phase<1> and the third polling clock signal Phase<2> are valid only during a validity period of the first polling clock signal Phase<0>, and a time length of the validity period (corresponding toa period between time t0 and time t3 in FIG. 3) in each cycle of the first polling clock signal Phase<0> is equal to a sum of a time length of a preset delay period (corresponding to a period between the time t0 and time t1 in FIG. 3), a time length of the validity period (corresponding to the period between the time t1 and the time t2 in FIG. 3) in one cycle of the second polling clock signal Phase<1>, and a time length of the validity period (corresponding to the period between the time t2 and the time t3 in FIG. 3) in one cycle of the third polling clock signal Phase<2>.

In step S12, triggering generation of a reference voltage during the validity period of the first polling clock signal among the plurality of polling clock signals.

During a high level period of the first polling clock signal Phase<0>, a bandgap reference circuit in a start circuit is triggered and generates the reference voltage. And during a low level period of the first polling clock signal Phase<0>, the bandgap reference circuit in the circuit is triggered to be turned off.

In step S13, detecting a state signal corresponding to the first type of detection item according to priority during a validity period of the second polling clock signal among the plurality of polling clock signals, and generating the first selection signal according to a corresponding detection result.

This step specifically includes: obtaining a count value by performing counting on a number of cycles of the second polling clock signal, and restarting the counting when the count value reaches a threshold, which indicates that one detection large cycle is completed; detecting the state signal corresponding to the first type of detection item in turn according to the priority in an initial detection large cycle; selecting a part of detection item in the first type of detection items for detection according to a detection result of a previous detection large cycle in each non-initial detection large cycle.

In this embodiment, the priority of the first type of detection items (or the state signal corresponding to the first type of detection items) is determined according to a detection result of a previous detection large cycle and a current circuit status. In the initial detection large cycle after the circuit is initialized (it may be assumed that all detection items before the circuit is initialized are in an non-triggered state), the priority of the first type of detection items (or the state signal corresponding to the first type of detection item) includes that: a priority of a lowest charging and discharging voltage threshold detection item nochg is higher than a priority of a lowest protection temperature detection item v_n10, the priority of the lowest protection temperature detection item v_n10 is higher than a priority of a highest protection temperature detection item v_60, the priority of the highest protection temperature detection item v_60 is higher than a priority of a first intermediate temperature detection item v_0, the priority of the first intermediate temperature detection item v_0 is higher than a priority of a second intermediate temperature detection item v_45, and the priority of the second intermediate temperature detection item v_45 is higher than a priority of a overvoltage threshold detection item ovp and a priority of a undervoltage threshold detection item uvp. After one polling detection is completed on each detection item, the circuit sequentially and alternately detects the overvoltage threshold detection item ovp and the undervoltage threshold detection item uvp until protection is triggered or the current detection large cycle is finished.

That is, in the initial detection large cycle, when any one of the state signals of the lowest charging and discharging voltage threshold detection item nochg, the overvoltage threshold detection item ovp, the undervoltage threshold detection item uvp, the lowest protection temperature detection item v_n10 and the highest protection temperature detection item v_60 is detected to be in a triggered state, a corresponding current triggered item is continuously detected until the triggered state is released or the count value reaches the threshold (the current detection large cycle is ended); or in the initial detection large cycle, when any one of the state signals of the first intermediate temperature detection item v_0 and the second intermediate temperature detection item v_45 is detected to be in the triggered state, only the undervoltage threshold detection item uvp is detected until the triggered state is released or the count value reaches the threshold. Specifically, 1) the detection item nochg is detected firstly, if the detection item nochg is triggered, the circuit turns off a main transmission transistor, and inhibits charging and discharging, and only detects the detection item nochg in a next second polling clock signal Phase<1> until this state is released;

2) if the detection item nochg is not triggered, the circuit sequentially detects the detection item V_n10, when a chip temperature is detected to be lower than a lowest protection temperature (e.g., minus 10° C.), the circuit turns off the main transmission transistor, and inhibits charging and discharging, and only detects the detection item V_n10 in the next second polling clock signal Phase<1>, until this state is released;

3) if the detection item V_n10 is not triggered, the circuit sequentially detects the detection item V_60, when the chip temperature is detected to be higher than a highest protection temperature (e.g., 60° C.), the circuit turns off the main transmission transistor, and inhibits charging and discharging, and only detects the detection item V_60 in the next second polling clock signal Phase<1> until this state is released;

4) if the test item V_60 is not triggered, the circuit sequentially tests the test item V_0, when the chip temperature is lower than a first intermediate temperature (e.g., 0° C.), the circuit allows discharging but prohibits charging, and only detects the detection item uvp in the next second polling clock signal Phase<1> until this state is released;

5) if the detection item V_0 is not triggered, that is, the chip temperature is higher than the first intermediate temperature, the circuit sequentially detects the detection item V_45, when the chip temperature is detected to be higher than a second intermediate temperature (such as 45° C.), the circuit allows discharging but prohibits charging, and only detects the detection item uvp in the next second polling clock signal Phase<1> until this state is released;

6) if the detection item V_45 is not triggered, that is, the chip temperature is lower than the second intermediate temperature, the circuit sequentially and alternately detects the detection item ovp and the detection item uvp until protection is triggered, or calculating a number of cycle of a polled second polling clock signal Phase<1> by a counting module until a period of one detection large cycle is finished.

Further, selecting the part of detection item in the first type of detection item for detection according to the detection result of the previous detection large cycle in each non-initial detection large cycle includes: 1) if the undervoltage threshold detection item uvp in the detection result of the previous detection large cycle is in the triggered state, detecting the lowest charging and discharging voltage threshold detection item nochg, and otherwise, detecting the undervoltage threshold detection item uvp;

2) if the lowest protection temperature detection item V_n10 in the detection result of the previous detection large cycle is in the triggered state or the first intermediate temperature detection item V_O is in the triggered state, detecting the lowest protection temperature detection item V_n10, otherwise, detecting the overvoltage threshold detection item ovp;

3) if the second intermediate temperature detection item V_45 in the detection result of the previous detection large cycle is in the triggered state or the highest protection temperature detection item V_60 is in the triggered state, detecting the highest protection temperature detection item V_60, otherwise, detecting the undervoltage threshold detection item uvp;

4) if the first intermediate temperature detection item V_O in the detection result of the previous detection large cycle is in the triggered state or the temperature detection items are in the non-triggered state, detecting the first intermediate temperature detection item V_O, and if the lowest protection temperature detection item V_n10 in the detection result of the previous detection large cycle is in the triggered state or the second intermediate temperature detection item V_45 in the detection result of the previous detection large cycle is in the triggered state, detecting the under-voltage threshold detection item uvp;

5) if the temperature detection items in the detection result of the previous detection large cycle are all in the non-triggered state or the second intermediate temperature detection item V_45 is in the triggered state, detecting the second intermediate temperature detection item V_45, and if the highest protection temperature detection item V_60 is in the triggered state or the lowest protection temperature detection item V_n10 is in the triggered state or the first intermediate temperature detection item V_0 is in the triggered state, detecting the under-voltage threshold detection item uvp;

6) alternately detecting the overvoltage threshold detection item ovp and the undervoltage threshold detection item uvp, and when either one of the overvoltage threshold detection item ovp and the undervoltage threshold detection item uvp is detected to be in the triggered state, continuously detecting a corresponding current triggered item until the triggered state is released, and recovering an alternating detection.

That is, in each non-initial detection large cycle, firstly, the state signal of the undervoltage threshold detection item uvp in the previous detection large cycle is recognized and detected based on the reference voltage, and the det_nochg signal or the det_uvp signal is selected to be output as the first selection signal det_X according to the trigger state of the undervoltage threshold detection item uvp; then, the state signals of the protection temperature detection items in the previous detection large cycle are respectively recognized and detected based on the reference voltage, so as to select two of the det_abv_n10 signal, the det_abv_60 signal, the det_abv_0 signal and the det_abv_45 signal according to the state signals of the protection temperature detection items (to further determine the triggered states of the protection temperature detection items in the current detection large cycle, update the corresponding state signals), the det_ovp signal and the det_uvp signal to be respectively output as the first selection signal det_X in a small cycle (one small cycle corresponds to one cycle of the second polling clock signal Phase<1>); and finally, the det_ovp signal and the det_uvp signal are alternately output as the first selection signal det_X in the remaining small cycle of the current initial detection large cycle. Meanwhile, the same as the initial detection large cycle, when the detection item corresponding to the output first selection signal det_X is recognized to be in the triggered state, the same first selection signal det_X is continuously output in the following cycle of the second polling clock signal Phase<1> to continuously detect the item to be detected until the triggered state is released or the current detection large cycle is finished.

Furthermore, after each detection large cycle is completed, the method further includes latching a current detection result.

In step S14, detecting a state signal corresponding to the second type of detection items according to the priority during a validity period of the third polling clock signal among the plurality of polling clock signals, and generating a first selection signal according to a detection result.

This step further includes: in the validity period of the third polling clock signal Phase<2>, performing alternating detection on the state signals of the plurality of current threshold detection items, and when detecting that the state signal corresponding to a certain detection item in the state signals of the plurality of current threshold detection items is in the triggered state, continuously detecting a corresponding current triggered item until the triggered state is released, and recovering the alternating detection.

That is, after the third polling clock signal Phase<2> is turned on, the det_occ signal and the det_ocd signal are output alternately as the first selection signal det_X during the validity period of the third polling clock signal Phase<2> (that is, the priority of the highest charging current threshold detection item occ and the priority of the highest discharging current threshold detection item ocd may be regarded to have a same level relationship). It should be understood that, during the high level of each cycle of the third polling clock signal Phase<2>, only one of the det_occ signal and the det_ocd signal is output, and when the detection item corresponding to the output first selection signal det_X is recognized to be in the triggered state in a certain period, the same first selection signal det_X is continuously output in the following cycle of the third polling clock signal Phase<2> to continuously detect this item to be detected until the triggered state is released, and an alternating detection state is recovered.

In step S15, generating a second selection signal according to the first selection signal, the reference clock signal, and a second enable signal among the plurality of enable signals.

When the polling object selecting unit 220 outputs a first selection signal det_X, the detection enabling unit 230 is triggered to output the second selection signal sen_X representing a same item to be detected based on the second enable signal among the plurality of enable signals the reference clock signal. Wherein the second selection signal sen_X is used for triggering sampling of a detection result of a current item to be detected.

In step S2, selecting one of a plurality of reference signals corresponding to the plurality of detection items and one of a plurality of feedback signals for comparison based on the first selection signal to obtain a comparison result.

Signal parameters corresponding detection items in the chip are sampled by a plurality of sampling circuits arranged in the battery protection chip (or circuit), and then the plurality of feedback signals corresponding to the plurality of detection items are obtained. And the plurality of reference signals are generated by a post stage circuit of the battery protection chip, when the input array selector 100 receives the first selection signal det_X, the feedback signal and the reference signal corresponding to the item to be detected are selected based on the item to be detected corresponding to the first selection signal det_X and output to the comparator 300, and the comparator 300 compares the feedback signal and the reference signal that are received by the comparator 300.

In step S3, sampling the comparison result according to the second selection signal, and updating the plurality of state signals according to a corresponding sampling result.

In this embodiment, when the second selection signal sen_X received by the output sampler 400 changes to a high level, a level state of the indication signal Vout which is output by the comparator 300 is sampled, so as to obtain a state signal of the item to be detected in the validity period of the current polling detection. In each detection large cycle, the output sampler 400 repeats this operation to obtain the state signals corresponding to the plurality of detection items in the current detection large cycle, that is, to update the plurality of state signals in the previous detection large cycle.

In the present disclosure, several cycles of the second polling clock signals Phase<1> is referred to as one detection large cycle. And each high level period of the second polling clock signal Phase<1> and each high level period of the third polling clock signal Phase<2> is a polling detection validity period.

For example, a case where 32 cycles of the second polling clock signal Phase<1> (each cycle of the second polling clock signal Phase<1> is a small cycle) serving as a detection large cycle, the minimum protection temperature being minus 10° C., the first intermediate protection temperature being 0° C., the second intermediate protection temperature being 45° C., and the highest protection temperature being 60° C. in a certain battery protection chip is taken as an example for illustration. It is assumed that in the initial detection large cycle, a voltage value of the battery is a normal value, a plurality of voltage threshold detection items are not triggered, and a temperature of the battery is minus 2° C.

Then, in the initial detection large cycle and a first small cycle, the lowest charging and discharging voltage threshold detection item nochg is detected, wherein a corresponding detection result is in non-triggered state; in a second small cycle, the lowest protection temperature detection item v_n10 is detected, wherein a corresponding detection result is in non-triggered state; in a third small cycle, the highest protection temperature detection item v_60 is detected, wherein a corresponding detection result is in non-triggered state; in a fourth small cycle, the first intermediate temperature detection item v_0 is detected, if a corresponding detection result is that the detection item is in triggered state, the circuit is allowed to be discharged but prohibiting charging, and in a next first polling clock signal Phase<1>, only the undervoltage threshold detection item uvp is detected until the triggered state of the first intermediate temperature detection item v_0 is released, namely the battery temperature is higher than the first intermediate temperature, for example, 0° C.; in a small cycle after the triggered state of the first intermediate temperature detection item v_0 is released, a second intermediate temperature detection item v_45 is detected, wherein a corresponding detection result is in non-triggered state; in all the small cycles from the current small cycle to the terminal of the 32th small cycle, the overvoltage threshold detection item ovp and the undervoltage threshold detection item uvp are detected alternately in sequence, and the detection result in each small cycle is in non-triggered state. And when the 32 small cycles are ended, latching a last detection result corresponding to each detection item in the 32 small cycles.

In a second detection large cycle (the detection large cycle is the non-initial detection large cycle), the voltage value of the battery is assumed to be a normal value at the moment, and the temperature of the battery is changed to 15° C. In each small cycle, the detection of the state signal is to detect the level state of the state signal of the corresponding detection item latched in the previous detection large cycle based on the reference voltage, and it is assumed that the state signal at the high level represents the triggered state and the state signal at the low level represents the non-triggered state.

Therefore, in the second detection large cycle, in the first small cycle, the level state of the state signal uvp_t is detected, and the detection result is that the under-voltage threshold detection item uvp is not triggered, so that the current small cycle detects the under-voltage threshold detection item uvp; in a second small cycle, detecting the state signal T_abv_n10 and the state signal T_abv_0, wherein the detection result is that the lowest protection temperature detection item v_n10 is not triggered, and the first intermediate temperature detection item v_0 is not triggered, then detecting the overvoltage threshold detection item ovp in the current small cycle; in a third small cycle, detecting the state signal T_abv_60 and the state signal T_abv_45, wherein the detection result is that the highest protection temperature detection item v_60 is not triggered and the second intermediate temperature detection item v_45 is not triggered, so that the current small cycle detects the undervoltage threshold detection item uvp; in the fourth small cycle, because the detection results of detecting the state signals of all the corresponding protection temperature detection items in the previous small cycles are not triggered, the current small cycle detects the first intermediate temperature detection item v_0, and the detection result of the current small cycle is not triggered; in a fifth small cycle, because the detection results of detecting the state signals of all the corresponding protection temperature detection items in the previous small cycles are all not triggered and the first intermediate temperature detection item v_0 is detected in the fourth small cycle, the second intermediate temperature detection item v_45 is detected in the current small cycle, and the detection result of the current small cycle is not triggered, so that the battery temperature in the current detection large cycle can be determined to be between the first intermediate temperature and the second intermediate temperature; in all the small cycles from the small cycle to the terminal of the 32th small cycle, the overvoltage threshold detection item ovp and the undervoltage threshold detection item uvp are detected alternately in sequence, and the detection result in each small cycle is not triggered. And when the 32 small cycles are ended, latching a last detection result corresponding to each detection item in the 32 small cycles.

And in all the detection large cycles from the third detection large cycle to the later detection large cycle, polling detection is carried out on all the detection items by adopting a polling detection method similar to the second detection large cycle. Furthermore, in each non-initial detection large cycle, the range of the battery temperature and the temperature triggering condition in the current detection large cycle may be determined only by detecting partial protection temperature detection items, so that a polling efficiency of key performance parameters is improved, and waste of polling resources is effectively reduced.

Based on a unified aspect concept, the present disclosure further relates to a battery protection chip. The battery protection chip includes a plurality of sampling circuits, a polling detection circuit based on the battery protection chip and a protection circuit, wherein the polling detection circuit is described in the FIGS. 1 to 3. The polling detection circuit is respectively connected with the sampling circuits and the protection circuit and is used for polling and detecting the detection items according to the priority of the detection items and generating a plurality of state signals according to polling and detecting results; the protection circuit is used for controlling on and off of a battery charging and discharging path according to the plurality of state signals, and protecting the battery protection chip.

In summary, the present disclosure uses the polling signal generator to determine an item to be detected in the validity period of next polling detection based on the priorities of the basic clock signal, the plurality of state signals and the plurality of detection items, and meanwhile, the plurality of state signals are continuously updated according to a determined item to be detected, so that the priority and combined judgment may be made according to the self-characteristics and a mutual condition relation of different items to be detected and a circuit state and a current state of a previous polling cycle (corresponding to a previous detection large cycle), which is help to allocate time and resource of effective polling detection as needed in a certain long polling cycle, so that a polling efficiency of key performance parameters is improved on a basis of ensuring a polling timeliness, and waste of polling resources is also effectively reduced.

On the other hand, selective detection on the plurality of detection items including the plurality of voltage threshold detection items and the plurality of temperature detection items is performed by respectively adopting different priority processing modes in the initial detection large cycle and the non-initial detection large cycle, so that a temperature signal which changes slowly is capable of being polled in a large cycle with basis, and a signal which changes relatively quickly is capable of being polled more efficiently in a small cycle, polling resources is utilized more reasonably, and power consumption of polling is effectively reduced.

It should be noted that, in this document, the contained items "includes," "comprising," or any other variation thereof, are intended to cover a non-exclusive inclusion, such that a process, method, article, or apparatus that includes a list of elements does not include only those elements but may include other elements not expressly listed or inherent to such process, method, article, or apparatus. Without further limitation, an element defined by the phrase "comprising an . . . " does not exclude the presence of other identical elements in a process, method, article, or apparatus that includes the element.

Finally, it should be noted that: it should be understood that the above examples are only for clearly illustrating the present disclosure and are not intended to limit the embodiments. Other variations and modifications will be apparent to persons skilled in the art in light of the above description. And are neither required nor exhaustive of all embodiments. And obvious variations or modifications of the present disclosure may be made without departing from the scope of the present disclosure.

What is claimed is:

1. A polling detection circuit based on a battery protection chip, comprising:
   a polling signal generator, for receiving a basic clock signal and a plurality of state signals each representing a trigger state of a corresponding one of a plurality of detection items of the battery protection chip, and generating a first selection signal and a second selection signal based on the basic clock signal, the plurality of state signals and a priority of the plurality of detection items, wherein the first selection signal and the second selection signal represent a same item to be detected in a next polling detection validity period;
   an input array selector, connected to the polling signal generator, for receiving a plurality of reference signals and a plurality of feedback signals corresponding to the plurality of detection items, and selecting one of the plurality of reference signals and one of the plurality of feedback signals to output based on the first selection signal;
   a comparator, connected to the input array selector, for performing comparison between the feedback signal and the reference signal that are received and outputting an indication signal correspondingly; and
   an output sampler, respectively connected with the comparator and the polling signal generator to receive the second selection signal and the indication signal, for obtaining a sampling result by sampling the indication signal according to the second selection signal and updating the plurality of state signals according to the sampling result.

2. The polling detection circuit according to claim 1, wherein the polling signal generator comprises:
   a polling clock generating unit, for receiving the basic clock signal and generating a plurality of polling clock signals, a plurality of enable signals and a reference clock signal based on the basic clock signal;
   a polling object selecting unit, connected to the polling clock generating unit, for receiving the plurality of polling clock signals, the plurality of state signals, and one or more first enable signals in the plurality of enable signals, and detecting the plurality of state signals based on the plurality of polling clock signals, the one or more first enable signals, and the priority of the plurality of detection items, so as to generate the first selection signal according to a detection result;
   a detection enabling unit, respectively connected to the polling clock generating unit and the polling object selecting unit, for generating the second selection signal based on a second enable signal in the plurality of enable signals, the first selection signal, and the reference clock signal.

3. The polling detection circuit according to claim 2, wherein the plurality of polling clock signals comprises:
   a first polling clock signal for triggering generation of a reference voltage in a validity period;
   a second polling clock signal for triggering detection of a state signal corresponding to a first type of detection item of the plurality of detection items according to the priority in a validity period;
   a third polling clock signal for triggering alternating detection of a state signal corresponding to a second type of detection item in the plurality of detection items according to the priority in a validity period.

4. The poll detection circuit according to claim 3, wherein a time length of the validity period in each cycle of the first polling clock signal is equal to a sum of a time length of a preset delay period, a time length of the validity period in one cycle of the second polling clock signal, and a time length of the validity period in one cycle of the third polling clock signal.

5. The polling detection circuit according to claim 3, wherein the polling object selecting unit comprises:
  a first priority processing subunit, for receiving the state signal corresponding to the first type of detection item, detecting the state signal corresponding to the first type of detection item in the validity period of the second polling clock signal according to the priority and the reference voltage, and generating the first selection signal according to a corresponding detection result;
  a second priority processing subunit, for receiving the state signal corresponding to the second type of detection item, detecting the state signal corresponding to the second type of detection item in the validity period of the third polling clock signal according to the priority and the reference voltage, and generating the first selection signal according to a corresponding detection result;
  a counting and clock adjusting subunit, for obtaining a count value by performing counting on a number of cycles of the second polling clock signal, and restarting the counting once the count value reaches a threshold which indicates that one detection large cycle is completed, so as to implement adjustment on the time length of the preset delay period and the threshold,
  wherein the validity period of the third polling clock signal is after the validity period of the second polling clock signal.

6. The polling detection circuit according to claim 5, wherein the circuit further comprises:
  a storage module, connected with the output sampler, for latching the state signal corresponding to the first type of detection item after a preset time length.

7. The polling detection circuit according to claim 6, wherein the preset time length is equal to a sum of a plurality of cycles of the second polling clock signals, and the time length of the preset delay period is equal to a time length of the one detection large cycle.

8. The polling detection circuit according to claim 7, wherein the first type of detection item comprises a plurality of voltage threshold detection items and a plurality of temperature detection items, and the second type of detection item comprises a plurality of current threshold detection items.

9. The polling detection circuit according to claim 8, wherein performing detection of the plurality of voltage threshold detection items and the plurality of temperature detection items in an initial detection large cycle is to perform detection in turn according to the priority, and the detection in each non-initial detection large cycle is detection by selecting a part of detection items according to a latch result of a previous detection large cycle.

10. A battery protection chip, comprising:
  the polling detection circuit based on the battery protection chip according to claim 1, for performing polling detection on the plurality of detection items according to priority of the plurality of detection items, and generating a plurality of state signals according to a result of the polling detection; and
  a protection circuit, connected to the polling detection circuit based on the battery protection chip, for controlling on and off of a battery charging and discharging path according to the plurality of state signals.

11. A polling detection method based on a battery protection chip, wherein the polling detection method is applicable to the polling detection circuit based on the battery protection chip according to claim 1, and the method comprises:
  generating a first selection signal and a second selection signal based on a basic clock signal, a plurality of state signals and a priority of the plurality of detection items, wherein the first selection signal and the second selection signal represent a same item to be detected in a next polling detection validity period;
  selecting one of a plurality of reference signals corresponding to the plurality of detection items and one of a plurality of feedback signals for comparison to obtain a comparison result based on the first selection signal; and
  obtaining a sampling result by sampling the comparison result according to the second selection signal, and updating the plurality of state signals according to the sampling result.

12. The polling detection method according to claim 11, wherein the plurality of detection items comprises a first type of detection items and a second type of detection items,
  the first type of detection items comprise a plurality of voltage threshold detection items and a plurality of temperature detection items, and the second type of detection items comprise a plurality of current threshold detection items.

13. The polling detection method according to claim 12, wherein generating the first selection signal and the second selection signal based on the basic clock signal, the plurality of state signals and the priority of the plurality of detection items comprises:
  generating a plurality of polling clock signals, a plurality of enable signals and a reference clock signal based on the basic clock signal;
  triggering generation of a reference voltage in a validity period of a first polling clock signal among the plurality of polling clock signals;
  detecting a state signal corresponding to the first type of detection items in a validity period of a second polling clock signal among the plurality of polling clock signals according to the priority, and generating the first selection signal according to a corresponding detection result;
  detecting a state signal corresponding to the second type of detection items in a validity period of a third polling clock signal among the plurality of polling clock signals according to the priority, and generating the first selection signal according to a corresponding detection result;
  generating the second selection signal according to the first selection signal, the reference clock signal, and a second enable signal among the plurality of enable signals,
  wherein a time length of the validity period in each cycle of the first polling clock signal is equal to a sum of a time length of a preset delay period, a time length of the validity period in one cycle of the second polling clock signal, and a time length of the validity period in one cycle of the third polling clock signal.

14. The polling detection method according to claim 13, wherein detecting the state signal corresponding to the first type of detection item in the validity period of the second polling clock signal among the plurality of polling clock signals according to the priority comprises:
  obtaining a count value by performing counting on a number of cycles of the second polling clock signal, and restarting the counting once the count value reaches a threshold which indicates that one detection large cycle is completed;
  detecting the state signal corresponding to the first type of detection item in turn according to the priority in an initial detection large cycle;
  selecting a part of detection item in the first type of detection item for detection according to a detection result of a previous detection large cycle in each non-initial detection large cycle.

15. The polling detection method according to claim 14, wherein the plurality of voltage threshold detection items comprises a lowest charging and discharging voltage threshold detection item, an overvoltage threshold detection item, and an undervoltage threshold detection item;
  the plurality of temperature detection items comprises a lowest protection temperature detection item, a highest protection temperature detection item, a first intermediate temperature detection item and a second intermediate temperature detection item,
  wherein a first intermediate temperature corresponding to the first intermediate temperature detection item is lower than a second intermediate temperature corresponding to the second intermediate temperature detection item.

16. The polling detection method according to claim 15, wherein a priority of the lowest charging and discharging voltage threshold detection item is higher than a priority of the lowest protection temperature detection item, the priority of the lowest protection temperature detection item is higher than a priority of the highest protection temperature detection item, the priority of the highest protection temperature detection item is higher than a priority of the first intermediate temperature detection item, the priority of the first intermediate temperature detection item is higher than a priority of the second intermediate temperature detection item, and the priority of the second intermediate temperature detection item is higher than priorities of the overvoltage threshold detection item and the undervoltage threshold detection item.

17. The polling detection method according to claim 15, wherein in the initial detection large cycle, when the state signal of any one of the lowest charging and discharging voltage threshold detection item, the overvoltage threshold detection item, the undervoltage threshold detection item, the lowest protection temperature detection item and the highest protection temperature detection item is detected to be in a triggered state, a corresponding current triggered item is continuously detected until the triggered state is released or the count value reaches the threshold; or
  in the initial detection large cycle, when the state signal of any one of the first intermediate temperature detection item and the second intermediate temperature detection item is detected to be in the triggered state, only the undervoltage threshold detection item is detected until the triggered state is released or the count value reaches the threshold.

18. The polling detection method according to claim 15, wherein selecting the part of detection item in the first type of detection item for detection according to the detection result of the previous detection large cycle in each non-initial detection large cycle comprises:
  if the undervoltage threshold detection item in the detection result of the previous detection large cycle is in a triggered state, detecting the lowest charging and discharging voltage threshold detection item, and otherwise, detecting the undervoltage threshold detection item;
  if the lowest protection temperature detection item is in a triggered state or the second intermediate temperature detection item is in the triggered state in the detection result of the previous detection large cycle, detecting the lowest protection temperature detection, and otherwise, detecting the overvoltage threshold detection item;
  if the second intermediate temperature detection item is in the triggered state or the highest protection temperature detection item is in the triggered state in the detection result of the previous detection large cycle, detecting the highest protection temperature detection item, and otherwise, detecting the undervoltage threshold detection item;
  if the first intermediate temperature detection item is in a triggered state or the plurality of temperature detection items are in an non-triggered state in the detection result of the previous detection large cycle, detecting the first intermediate temperature detection item, and if the lowest protection temperature detection item is in a triggered state or the second intermediate temperature detection item is in a triggered state in the detection result of the previous detection large cycle, detecting the undervoltage threshold detection item;
  if the plurality of temperature detection items are all in an non-triggered state or the second intermediate temperature detection item is in a triggered state in the detection result of the previous detection large cycle, detecting the second intermediate temperature detection item, and if the highest protection temperature detection item is in a triggered state or the lowest protection temperature detection item is in a triggered state or the first intermediate temperature detection item is in a triggered state, detecting the under-voltage threshold detection item;
  performing alternating detection on the overvoltage threshold detection item and the undervoltage threshold detection item, and when any one of the overvoltage threshold detection item and the undervoltage threshold detection item is detected to be in the triggered state, continuously detecting a corresponding current triggered item until the triggered state is released, and recovering the alternating detection.

19. The polling detection method according to claim 13, wherein detecting the state signal corresponding to the second type of detection item in the validity period of the third polling clock signal among the plurality of polling clock signals according to the priority comprises:
  performing alternating detection on the state signals of the plurality of current threshold detection items in the validity period of the third polling clock signal, and when the state signal corresponding to a certain detection item in the state signals of the plurality of current threshold detection items is detected to be in a triggered state, continuously detecting a corresponding current triggered item until the triggered state is released, and recovering the alternating detection.

20. The polling detection method according to claim 14, wherein a current detection result is latched after each detection large cycle is completed.

* * * * *